US010043841B1

(12) United States Patent
Chang et al.

(10) Patent No.: US 10,043,841 B1
(45) Date of Patent: Aug. 7, 2018

(54) IMAGE SENSOR DEVICE AND METHOD FOR FORMING THE SAME

(71) Applicant: Taiwan Semiconductor Manufacturing Co., Ltd., Hsinchu (TW)

(72) Inventors: Chao-Ching Chang, Kaohsiung (TW); Sheng-Chan Li, Tainan (TW); Cheng-Hsien Chou, Tainan (TW); Tsung-Wei Huang, Taichung (TW); Min-Hui Lin, Tainan (TW); Yi-Ming Lin, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/663,985

(22) Filed: Jul. 31, 2017

(51) Int. Cl.
*H01L 21/00* (2006.01)
*H01L 27/146* (2006.01)
*H01L 21/02* (2006.01)
*H01L 21/3105* (2006.01)

(52) U.S. Cl.
CPC ...... *H01L 27/1463* (2013.01); *H01L 21/0228* (2013.01); *H01L 21/02274* (2013.01); *H01L 21/31053* (2013.01); *H01L 27/1464* (2013.01); *H01L 27/14621* (2013.01); *H01L 27/14627* (2013.01); *H01L 27/14629* (2013.01); *H01L 27/14685* (2013.01)

(58) Field of Classification Search
None
See application file for complete search history.

(56) References Cited

U.S. PATENT DOCUMENTS

| 8,390,089 B2* | 3/2013 | Chen ............... H01L 27/1464 |
| | | 257/447 |
| 2009/0200625 A1* | 8/2009 | Venezia ............ H01L 27/1463 |
| | | 257/432 |
| 2016/0163749 A1* | 6/2016 | Yang ............... H01L 27/1463 |
| | | 257/446 |
| 2016/0204158 A1* | 7/2016 | Hsu ............... H01L 27/14643 |
| | | 257/459 |

* cited by examiner

*Primary Examiner* — Thien F Tran
(74) *Attorney, Agent, or Firm* — McClure, Qualey & Rodack, LLP

(57) ABSTRACT

A method for forming an image sensor device is provided. The method includes providing a substrate having a front surface and a back surface. The method includes removing a first portion of the substrate to form a first trench. The method includes forming a first isolation structure in the first trench. The first isolation structure has a top surface. The method includes removing a second portion of the first isolation structure and a third portion of the substrate to form a second trench passing through the first isolation structure and extending into the substrate. The method includes forming a second isolation structure in the second trench. The method includes forming a light-sensing region in the substrate. The method includes removing a fourth portion of the substrate to expose a first bottom portion of the second isolation structure and a backside of the light-sensing region.

20 Claims, 8 Drawing Sheets

IMAGE SENSOR DEVICE AND METHOD FOR FORMING THE SAME

BACKGROUND

The semiconductor integrated circuit (IC) industry has experienced rapid growth. Technological advances in IC materials and design have produced generations of ICs. Each generation has smaller and more complex circuits than the previous generation. However, these advances have increased the complexity of processing and manufacturing ICs.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, since feature sizes continue to decrease, fabrication processes continue to become more difficult to perform. Therefore, it is a challenge to form reliable semiconductor devices (e.g. image sensor devices) at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1B-1 is a top view of the image sensor device of FIG. 1B, in accordance with some embodiments.

FIG. 1D-1 is a top view of the image sensor device of FIG. 1D, in accordance with some embodiments.

FIG. 1G-1 is a top view of the image sensor device of FIG. 1G, in accordance with some embodiments.

DETAILED DESCRIPTION

Figure 1A:
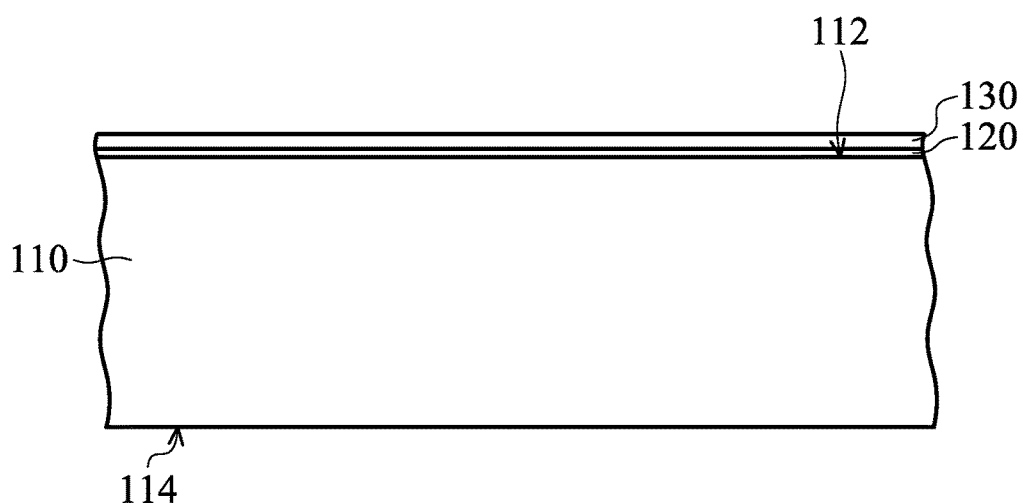
FIGS. 1A-1J are cross-sectional views of various stages of a process for forming an image sensor device, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

FIGS. 1A-1J are cross-sectional views of various stages of a process for forming an image sensor device 100, in accordance with some embodiments. As shown in FIG. 1A, a semiconductor substrate 110 is provided. The semiconductor substrate 110 has a front surface 112 and a back surface 114 opposite to the front surface 112.

The semiconductor substrate 110 may be a silicon substrate doped with a P-type dopant such as boron, in which case the semiconductor substrate 110 is a P-type substrate. Alternatively, the semiconductor substrate 110 could be another suitable semiconductor material. For example, the semiconductor substrate 110 may be a silicon substrate doped with an N-type dopant such as phosphorous or arsenic, in which case the substrate is an N-type substrate. The semiconductor substrate 110 may include other elementary semiconductor materials such as germanium.

As shown in FIG. 1A, a buffer layer 120 is formed over the front surface 112 of the substrate 110, in accordance with some embodiments. The buffer layer 120 includes a dielectric material, such as oxide (e.g., silicon oxide), in accordance with some embodiments. The buffer layer 120 is formed using a thermal oxidation process or another suitable process.

As shown in FIG. 1A, a stop layer 130 is formed over the buffer layer 120, in accordance with some embodiments. The buffer layer 120 and the stop layer 130 are made of different materials, in accordance with some embodiments. The stop layer 130 is thicker than the buffer layer 120, in accordance with some embodiments. The stop layer 130 includes nitride (such as silicon nitride), in accordance with some embodiments. The stop layer 130 is deposited using a chemical vapor deposition process or a physical vapor deposition process, in accordance with some embodiments.

The buffer layer 120 is used to buffer the stress between the stop layer 130 and the substrate 110, in accordance with some embodiments. The stop layer 130 is used as a polishing stop layer during subsequent polishing processes, in accordance with some embodiments.

Figure 1B:
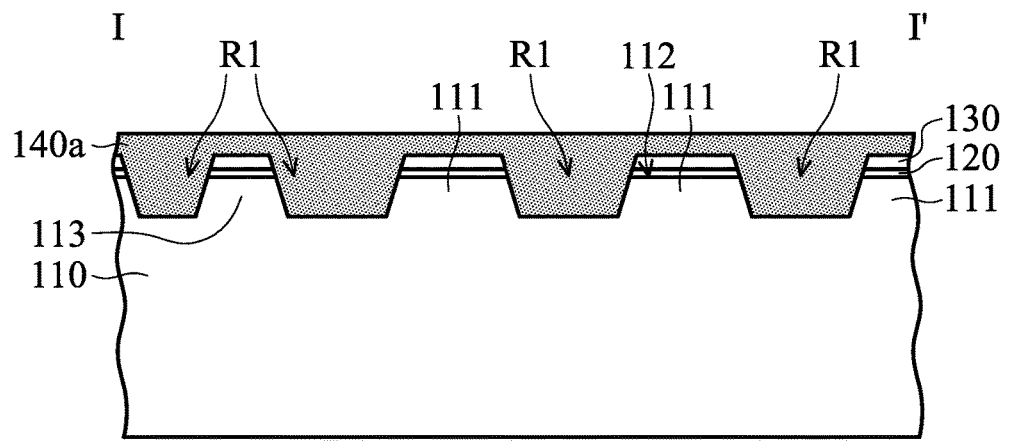
Figures 1, 1B:
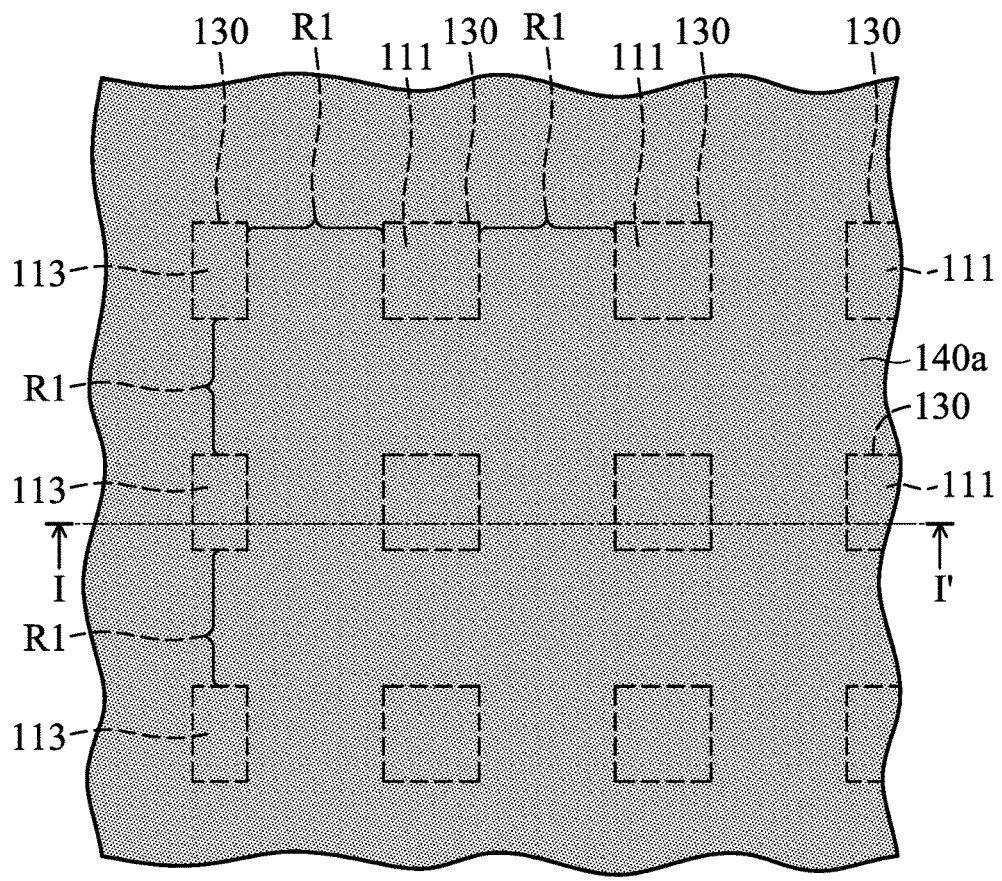

FIG. 1B-1 is a top view of the image sensor device of FIG. 1B, in accordance with some embodiments. FIG. 1B is a cross-sectional view illustrating the image sensor device along a sectional line I-I' in FIG. 1B-1, in accordance with some embodiments.

As shown in FIGS. 1B and 1B-1, portions of the stop layer 130, the buffer layer 120, and the substrate 110 are removed from the front surface 112 to form a trench R1, in accordance with some embodiments. The trench R1 passes through the stop layer 130 and the buffer layer 120 and extends into the substrate 110, in accordance with some embodiments. The trench R1 surrounds portions 111 and 113 of the semiconductor substrate 110, in accordance with some embodiments. The removal process includes a photolithography process and an etching process, such as a dry etching process, a wet etching process, a plasma etching process, or a combination thereof, in accordance with some embodiments.

As shown in FIGS. 1B and 1B-1, an insulating layer 140a is formed over the stop layer 130 and in the trench R1, in accordance with some embodiments. The trench R1 is filled with the insulating layer 140a, in accordance with some embodiments. The insulating layer 140a is formed using a chemical vapor deposition process, in accordance with some embodiments. The insulating layer 140a is made of an insulating material (or a dielectric material), such as silicon oxide, silicon nitride, silicon oxynitride, fluoride-doped silicate glass (FSG), a low-K dielectric material, other suitable materials, or combinations thereof, in accordance with some embodiments.

Figure 1C:
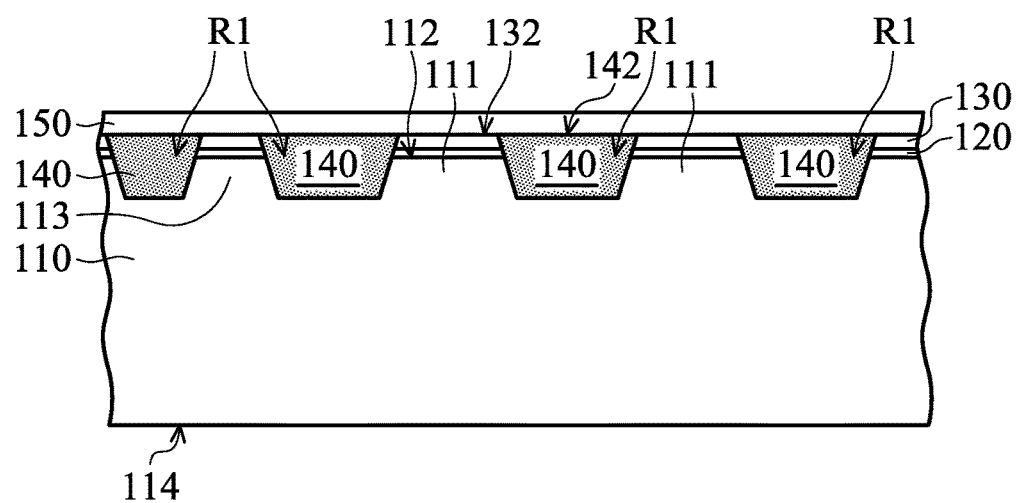

As shown in FIG. 1C, the insulating layer 140a outside of the trench R1 is removed, in accordance with some embodiments. After the removal process, the insulating layer 140a remaining in the trench R1 forms an isolation structure 140, in accordance with some embodiments. The isolation structure 140 is also referred to as a shallow trench isolation (STI) structure, in accordance with some embodiments.

In some embodiments, isolation structure 140 are formed in the semiconductor substrate 110 to define various light-sensing regions subsequently formed in the semiconductor substrate 110, and to electrically isolate neighboring devices (e.g. transistors) from one another. In some embodiments, the isolation structure 140 is formed adjacent to or near the front surface 112. The trench R1 is entirely filled with the isolation structure 140, in accordance with some embodiments. The isolation structure 140 surrounds the portions 111 and 113 of the semiconductor substrate 110, in accordance with some embodiments.

The isolation structure 140 has a top surface 142 facing away from the back surface 114, in accordance with some embodiments. The top surface 142 and a top surface 132 of the stop layer 130 are coplanar, in accordance with some embodiments. The removal process includes performing a chemical mechanical polishing process on the insulating layer 140a until the stop layer 130 is exposed, in accordance with some embodiments.

As shown in FIG. 1C, a protection layer 150 is formed over the front surface 112 to cover the isolation structure 140 and the stop layer 130, in accordance with some embodiments. The protection layer 150 is used to protect the isolation structure 140 from damage during subsequent etching process, in accordance with some embodiments.

The protection layer 150 is made of a dielectric material, in accordance with some embodiments. The protection layer 150 is a plasma enhanced oxide (PEOX) layer, in accordance with some embodiments. The protection layer 150 is formed using a chemical vapor deposition process, in accordance with some embodiments.

Figure 1D:
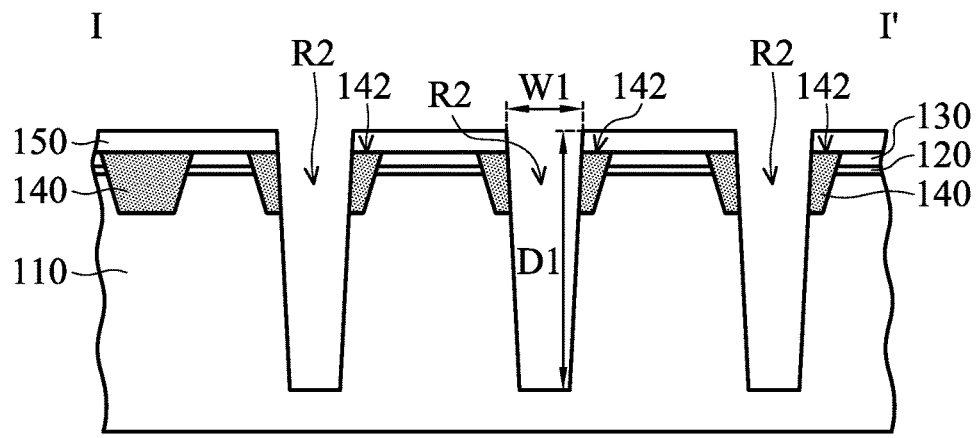
Figures 1, 1D:
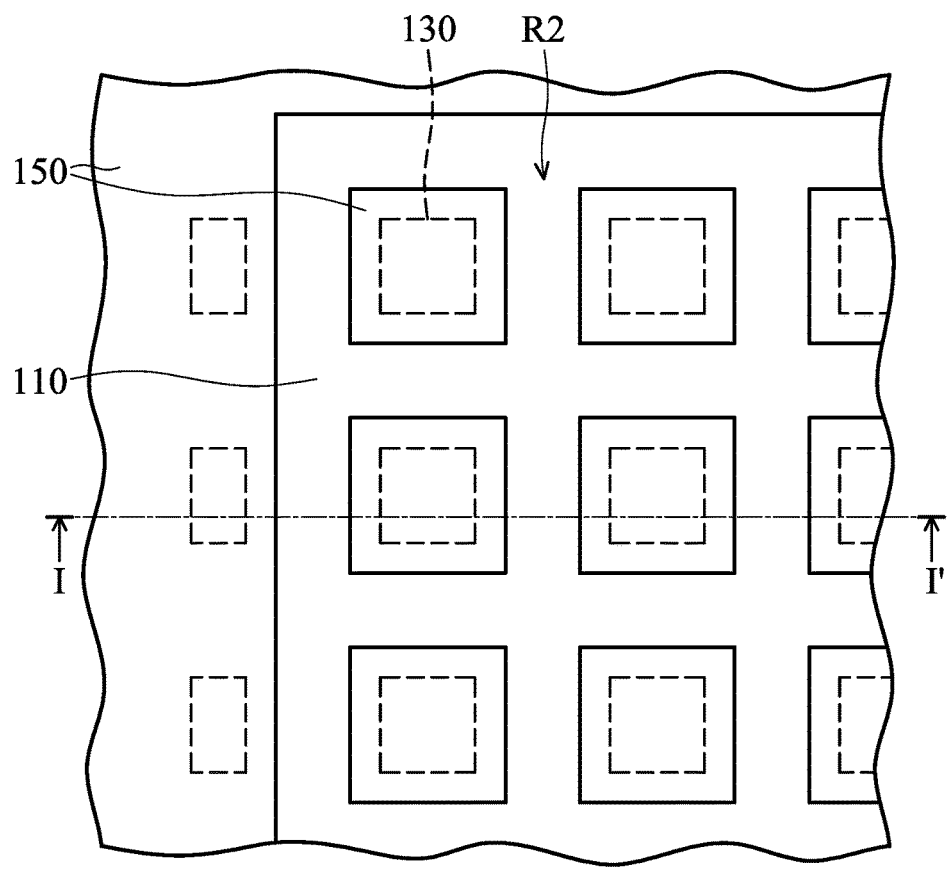

FIG. 1D-1 is a top view of the image sensor device of FIG. 1D, in accordance with some embodiments. FIG. 1D is a cross-sectional view illustrating the image sensor device along a sectional line I-I' in FIG. 1D-1, in accordance with some embodiments.

As shown in FIG. 1D, portions of the protection layer 150, the isolation structure 140, and the semiconductor substrate 110 are removed, in accordance with some embodiments. The portion of the isolation structure 140 is removed from the top surface 142, in accordance with some embodiments. The removal process forms a trench R2, in accordance with some embodiments.

The trench R2 passes through the protection layer 150 and the isolation structure 140 and extends into the semiconductor substrate 110 under the isolation structure 140, in accordance with some embodiments. The trench R2 has a width W1 and a depth D1, in accordance with some embodiments. The depth D1 ranges from about 2 μm to about 10 μm, in accordance with some embodiments. The depth D1 ranges from about 3 μm to about 8 μm, in accordance with some embodiments.

An aspect ratio (D1/W1) of the trench R2 ranges from about 10 to about 100, in accordance with some embodiments. The aspect ratio (D1/W1) ranges from about 10 to about 40, in accordance with some embodiments. The trench R2 is also referred to as a deep trench, in accordance with some embodiments.

Figure 1E:
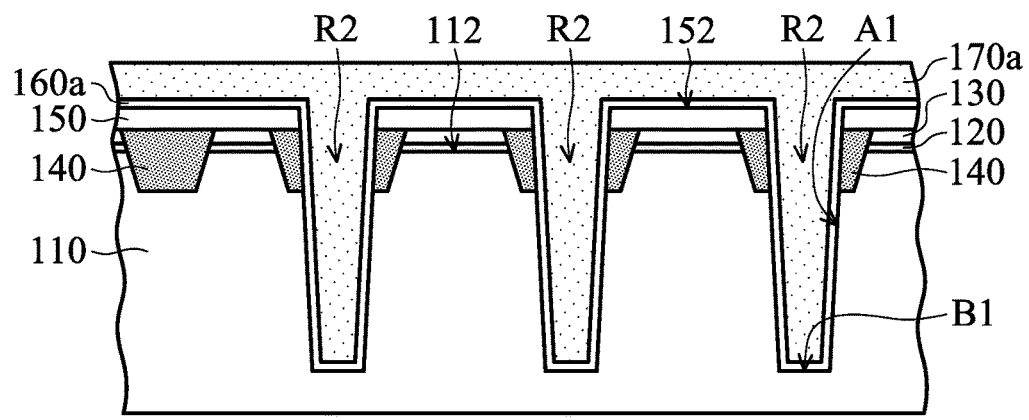

As shown in FIG. 1E, an insulating layer 160a is formed over the protection layer 150 and in the trench R2, in accordance with some embodiments. The insulating layer 160a conformally covers a top surface 152 of the protection layer 150 and inner walls A1 and a bottom surface B1 of the trench R2, in accordance with some embodiments.

The insulating layer 160a is made of a dielectric material, such as oxides (e.g. silicon oxides), in accordance with some embodiments. The insulating layer 160a is doped with boron, phosphorous, nitrogen, arsenic, fluorine, and/or another suitable mobile ion gettering material, in accordance with some embodiments.

The insulating layer 160a doped with boron, phosphorous, nitrogen, arsenic, or fluorine may be used to getter the mobile ions in the semiconductor substrate 110 prepared to form light-sensing regions so as to reduce noise signals caused by the mobile ions, in accordance with some embodiments.

The insulating layer 160a is formed by using a deposition process, such as a plasma enhanced atomic layer deposition (PEALD) process, in accordance with some embodiments. In some embodiments, a process gas used by the deposition process for forming the insulating layer 160a includes boron, phosphorous, nitrogen, arsenic, fluorine, and/or another suitable mobile ion gettering agent. In some embodiments, the process gas used by the deposition process for forming the insulating layer 160a further includes carbon. Therefore, the insulating layer 160a further includes carbon, in accordance with some embodiments.

As shown in FIG. 1E, an insulating layer 170a is formed over the insulating layer 160a and is filled into the trench R2, in accordance with some embodiments. The insulating layer 170a is made of a dielectric material, such as oxides (e.g. silicon oxides), in accordance with some embodiments.

The insulating layer 170a is formed using a deposition process, such as a plasma enhanced atomic layer deposition (PEALD) process, in accordance with some embodiments. The plasma enhanced atomic layer deposition process is able to fill the trench R2 (also referred to as a deep trench) well, in accordance with some embodiments. Therefore, there is no void formed in the insulating layer 170a in the trench R2, in accordance with some embodiments.

In some embodiments, the process gas used by the plasma enhanced atomic layer deposition process for forming the insulating layer 170a includes silicon and oxide. In some embodiments, the process gas used by the plasma enhanced atomic layer deposition process for forming the insulating layer 170a further includes carbon. Therefore, the insulating layer 170a further includes carbon, in accordance with some embodiments.

Figure 1F:
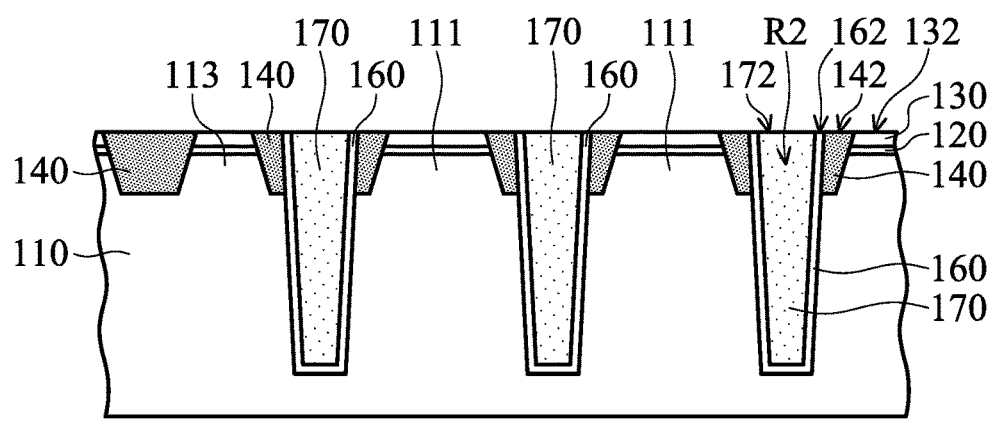

As shown in FIG. 1F, the insulating layers 160a and 170a outside of the trench R2 and the protection layer 150 are removed, in accordance with some embodiments. The insulating layer 160a remaining in the trench R2 forms a passivation layer 160, in accordance with some embodiments. The passivation layer 160 is also referred to as a mobile ion gettering layer, in accordance with some embodiments. The insulating layer 170a remaining in the trench R2 forms an isolation structure 170, in accordance with some embodiments. The isolation structure 170 is also referred to as a deep trench isolation (DTI) structure, in accordance with some embodiments.

The removal process of the insulating layers 160a and 170a outside of the trench R2 and the protection layer 150 includes performing a chemical mechanical polishing process on the insulating layer 170a until the stop layer 130 is exposed, in accordance with some embodiments. After the removal process, the top surface 142 of the isolation structure 140, a top surface 172 of the isolation structure 170, a top surface 162 of the passivation layer 160, and a top surface 132 of the stop layer 130 are coplanar, in accordance with some embodiments.

Figure 1G:
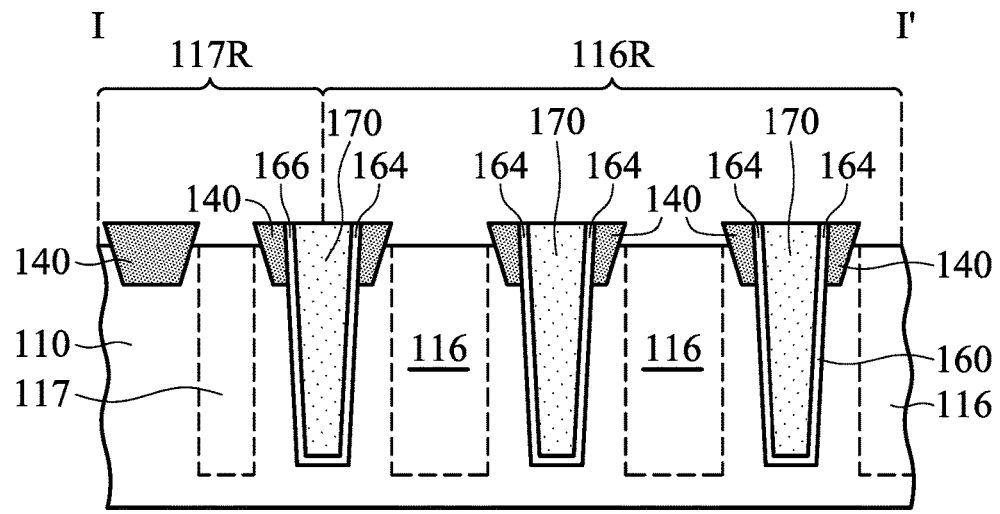
Figures 1, 1G:
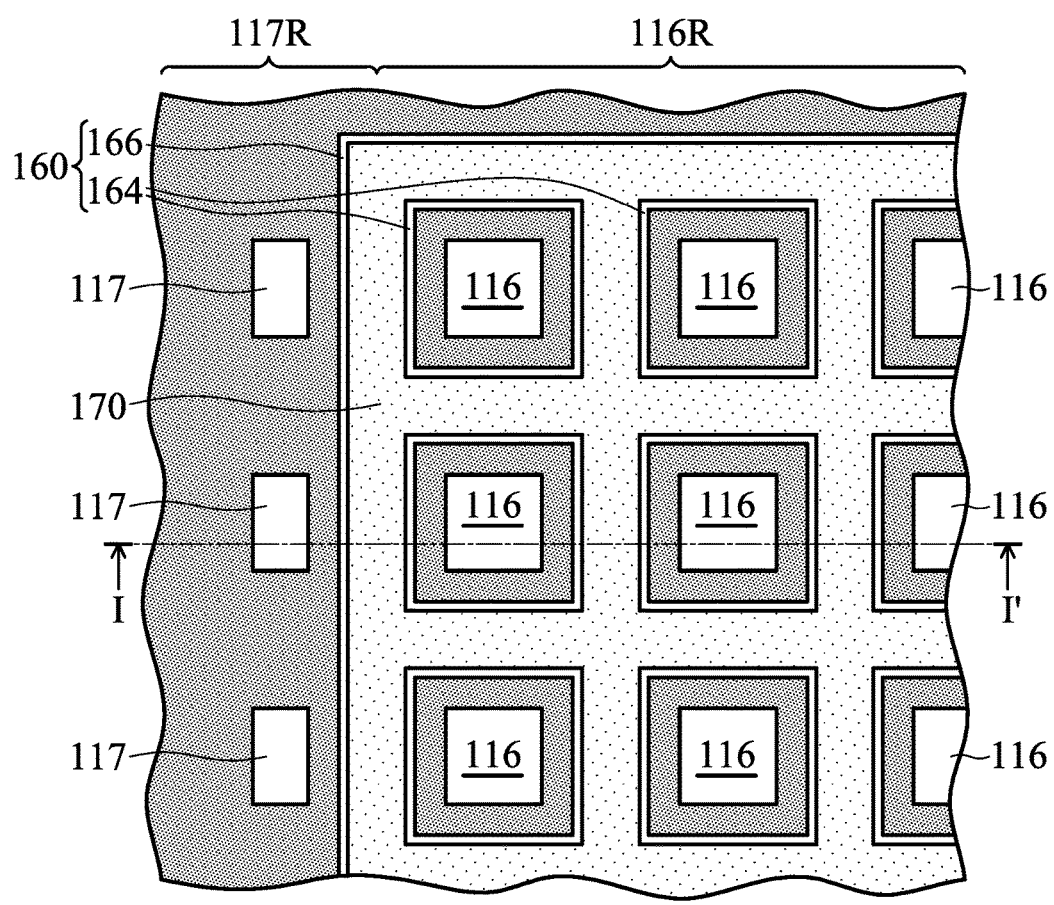

FIG. 1G-1 is a top view of the image sensor device of FIG. 1G, in accordance with some embodiments. FIG. 1G is a cross-sectional view illustrating the image sensor device along a sectional line I-I' in FIG. 1G-1, in accordance with some embodiments.

As shown in FIGS. 1F, 1G, and 1G-1, the buffer layer 120 and the stop layer 130 are removed, in accordance with some embodiments. As shown in FIGS. 1G and 1G-1, the passivation layer 160 and the isolation structure 170 pass through the isolation structure 140 and extend into the semiconductor substrate 110, in accordance with some embodiments. As shown in FIG. 1G-1, the isolation structure 170 surrounds a first portion 164 of the passivation layer 160, in accordance with some embodiments. In some embodiments, a second portion 166 of the passivation layer 160 surrounds the isolation structure 170.

As shown in FIG. 1G, light-sensing regions 116 are formed in the semiconductor substrate 110, in accordance with some embodiments. The light-sensing regions 116 are also referred to as radiation-sensing regions, in accordance with some embodiments. The passivation layer 160 and the isolation structure 170 surround the light-sensing regions 116, in accordance with some embodiments. The light-sensing regions 116 are doped with a doping polarity opposite from that of the semiconductor substrate 110, in accordance with some embodiments.

The light-sensing regions 116 are formed by one or more implantation processes or diffusion processes, in accordance with some embodiments. The light-sensing regions 116 are formed close to (or adjacent to, or near) the front surface 112 of the semiconductor substrate 110. The light-sensing regions 116 are operable to sense incident light (or incident radiation) that enters the light-sensing regions 116. The incident light may be visible light. Alternatively, the incident light may be infrared (IR), ultraviolet (UV), X-ray, microwave, other suitable types of light, or a combination thereof.

As shown in FIG. 1G, non-light-sensing regions 117 are formed in the semiconductor substrate 110 (or the portions 113 of the semiconductor substrate 110 of FIG. 1F), in accordance with some embodiments. The non-light-sensing regions 117 are formed close to (or adjacent to, or near) the front surface 112 of the semiconductor substrate 110, in accordance with some embodiments.

The non-light-sensing regions 117 are doped with a doping polarity opposite from or the same as that of the semiconductor substrate 110, in accordance with some embodiments. The non-light-sensing regions 117 are formed using one or more implantation processes or diffusion processes, in accordance with some embodiments.

When the non-light-sensing regions 117 are doped with a doping polarity opposite from that of the semiconductor substrate 110, the light-sensing regions 116 and the non-light-sensing regions 117 may be formed in the same implantation process or the same diffusion process, in accordance with some embodiments.

When the non-light-sensing regions 117 are doped with a doping polarity the same as that of the semiconductor substrate 110, the light-sensing regions 116 and the non-light-sensing regions 117 may be formed in different implantation processes or different diffusion processes, in accordance with some embodiments.

The semiconductor substrate 110 includes a pixel region 116R and a non-pixel region 117R, in accordance with some embodiments. The pixel region 116R includes pixels each with one of the light-sensing regions 116, in accordance with some embodiments. The non-pixel region 117R includes the non-light-sensing regions 117, in accordance with some embodiments. The non-light-sensing regions 117 include logic regions, periphery regions, bonding pad regions, and/or scribe line regions, in accordance with some embodiments.

Figure 1H:
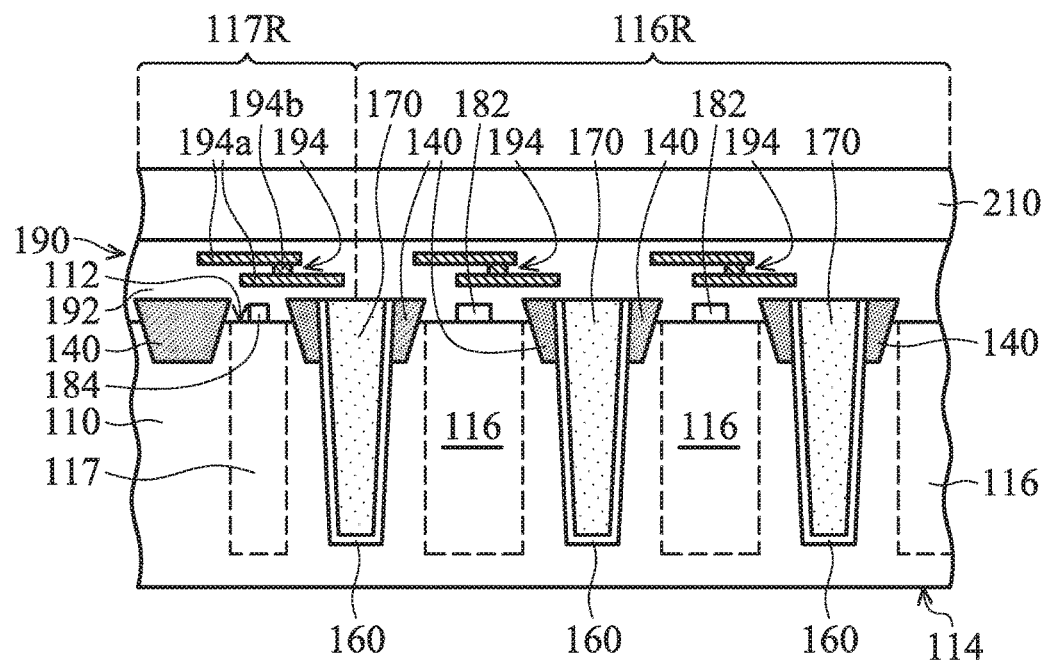

As shown in FIG. 1H, devices 182 and 184 are formed in and/or on the front surface 112, in accordance with some embodiments. The devices 182 and 184 include active devices and/or passive devices, in accordance with some embodiments. The devices 182 are formed in the pixel region 116R, in accordance with some embodiments. The devices 184 are formed in the non-pixel region 117R, in accordance with some embodiments. The devices 184 include transistors, capacitors, resistors, and/or another suitable device.

The devices 182 include photodiode gates, reset transistors, source follower transistors, transfer transistors, and/or pinned layers, in accordance with some embodiments. The transfer transistors are electrically connected with the light-sensing regions 116 to collect (or pick up) electrons generated by incident light (incident radiation) traveling into the light-sensing regions 116 and to convert the electrons into voltage signals, in accordance with some embodiments. For the sake of simplicity, detailed structures of the above features are not shown in figures of the present disclosure.

In some embodiments, an interconnection structure 190 is formed over the front surface 112. The interconnection structure 190 includes a number of patterned dielectric layers and conductive layers, in accordance with some embodiments. For example, the interconnection structure 190 includes an interlayer dielectric (ILD) layer 192 and a multilayer interconnection (MLI) structure 194 in the ILD layer 192.

The MLI structure 194 is electrically connected to various doped features, circuitry, and/or the devices 182 and 184 formed in and/or over the semiconductor substrate 110, in accordance with some embodiments.

The MLI structure 194 includes conductive lines 194a and vias (or contacts) 194b connected between the conductive lines 194a. It should be understood that the conductive lines 194a and the vias 194b are merely exemplary. The actual positioning and configuration of the conductive lines 194a and the vias 194b may vary depending on design needs and manufacturing concerns.

Afterwards, as shown in FIG. 1H, a carrier substrate 210 is bonded with the interconnection structure 190, in accordance with some embodiments. The carrier substrate 210 includes a silicon substrate, a glass substrate, or another suitable substrate.

Figure 1I:
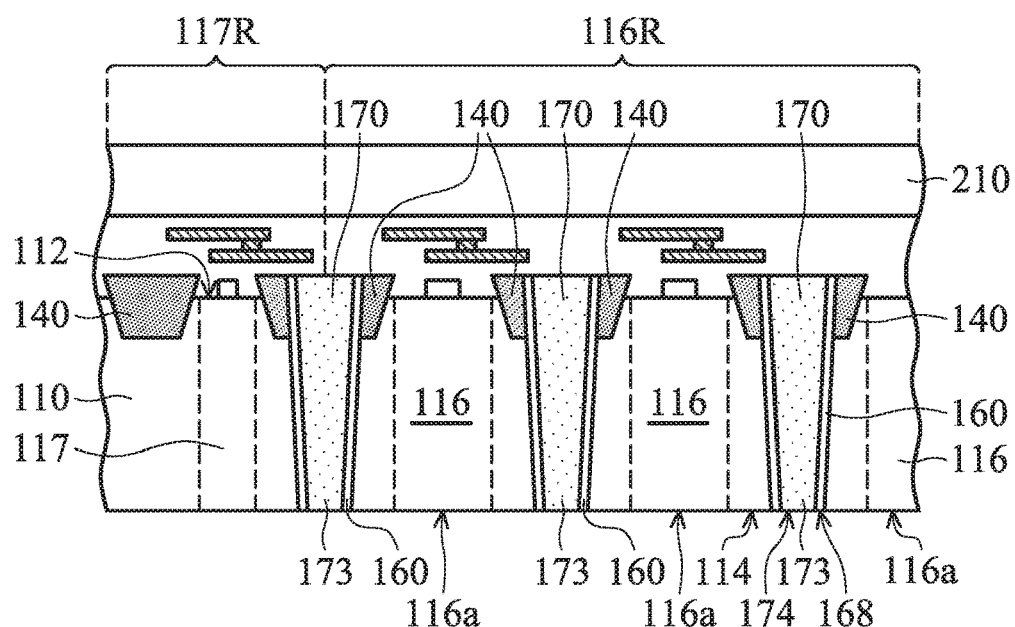

Thereafter, as shown in FIGS. 1H and 1I, a thinning process is performed to thin the semiconductor substrate 110 from the back surface 114 so as to expose a bottom portion 173 of the isolation structure 170 and a backside 116a of each of the light-sensing regions 116. The thinning process may include a chemical mechanical polishing process.

After the thinning process, the back surface 114, a bottom surface 174 of the isolation structure 170, and a bottom surface 168 of the passivation layer 160 are substantially coplanar, in accordance with some embodiments. The isolation structure 170 surrounds the respective light-sensing regions 116 and a portion of the isolation structure 140, in accordance with some embodiments. The isolation structure 170 surrounds the passivation layer 160, in accordance with some embodiments.

If two isolation structures are respectively formed from the back surface 114 and the front surface 112, the alignment accuracy of the two isolation structures is easily affected by warpage of the semiconductor substrate 110, in accordance with some embodiments. The isolation structures 140 and 170 are both formed from the front surface 112 (as shown in FIGS. 1D-1I), and therefore the alignment accuracy of the isolation structure 170 with respect to the isolation structure 140 is greater than the alignment accuracy of two isolation structures respectively formed from the back surface 114 and the front surface 112, in accordance with some embodiments. As a result, the process yield of the isolation structure 170 is improved, in accordance with some embodiments.

Figure 1J:
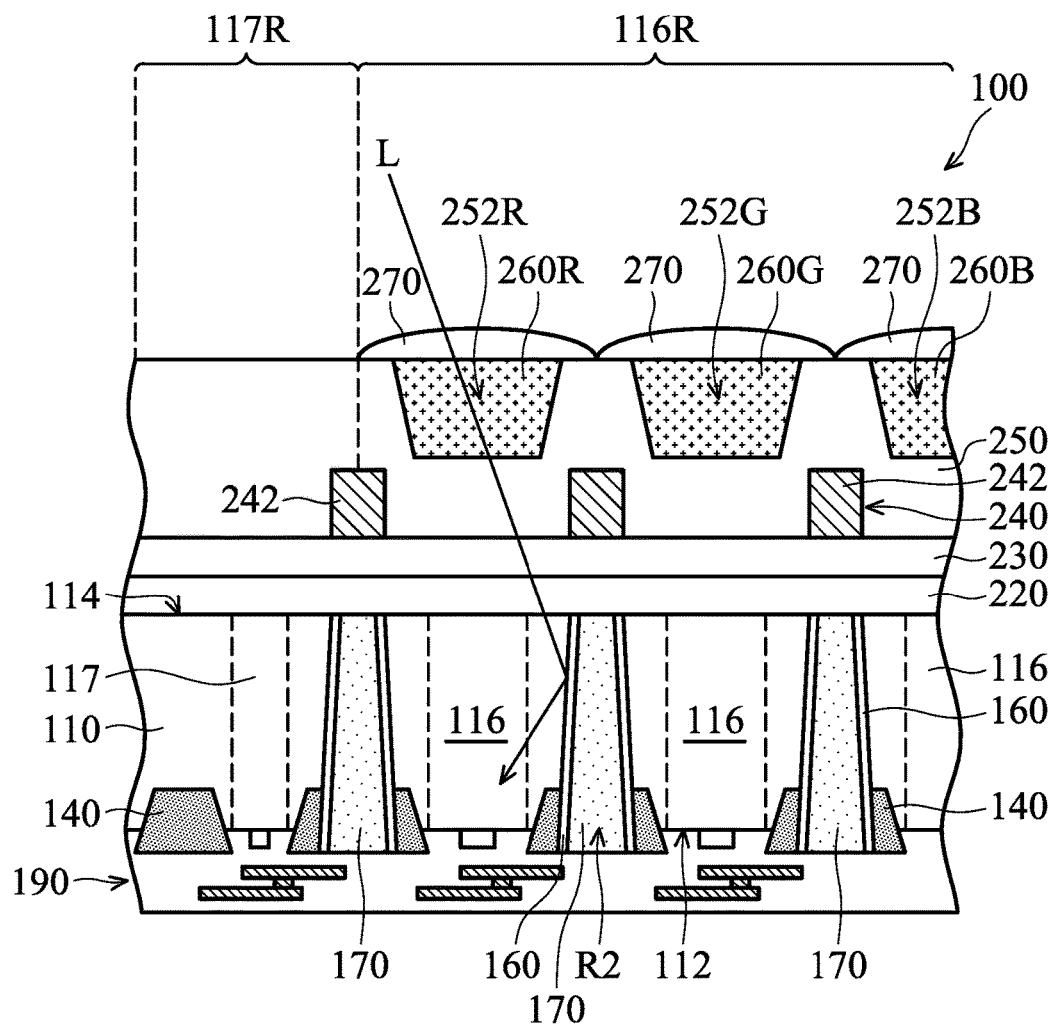

Afterwards, as shown in FIG. 1J, the semiconductor substrate 110 is flipped over, in accordance with some embodiments. As shown in FIG. 1J, an anti-reflection coating (ARC) layer 220 and a buffer layer 230 are sequentially formed over the back surface 114 of the semiconductor substrate 110, in accordance with some embodiments. The ARC layer 220 is used to reduce optical reflection from the back surface 114 of the semiconductor substrate 110 to ensure that most of an incident light enters the light-sensing regions 116 and is sensed.

The ARC layer 220 may be made of a high-k material, a dielectric material, other applicable materials, or a combination thereof. The high-k material may include hafnium oxide, tantalum pentoxide, zirconium dioxide, aluminum oxide, other suitable materials, or a combination thereof. The dielectric material includes, for example, silicon nitride, silicon oxynitride, other suitable materials, or a combination thereof.

The buffer layer 230 is used as a buffer between the ARC layer 220 and an overlying layer subsequently formed. The buffer layer 230 may be made of a dielectric material or other suitable materials. For example, the buffer layer 230 is made of silicon oxide, silicon nitride, silicon oxynitride, other applicable materials, or a combination thereof.

Thereafter, a reflective grid 240 is formed over the buffer layer 230, in accordance with some embodiments. The reflective grid 240 may include reflective elements 242. In some embodiments, the reflective elements 242 are aligned with (or right over) the isolation structure 170 in the trench R2. Each of the reflective elements 242 and the isolation structure 170 are used to prevent the incident light from entering a neighboring pixel. The crosstalk problems between pixels are thus prevented or reduced.

In some embodiments, the reflective grid 240 is made of a reflective material such as a metal material. The reflective grid 240 may be made of aluminum, silver, copper, titanium, platinum, tungsten, tantalum, tantalum nitride, other suitable materials, or a combination thereof. In some embodiments, the reflective grid 240 is formed over the buffer layer 230 using a suitable process. The suitable process includes, for example, a PVD process, an electroplating process, a chemical vapor deposition (CVD) process, other applicable processes, or a combination thereof.

Afterwards, a dielectric layer 250 is formed over the buffer layer 230 to cover the reflective grid 240, in accordance with some embodiments. The dielectric layer 250 may be made of silicon oxide, silicon nitride, silicon oxynitride, or another suitable transparent material. The dielectric layer 250 is formed by a CVD process or another suitable process. The dielectric layer 250 has multiple recesses 252R, 252G, and 252B.

Thereafter, visible light filters (such as color filters 260R, 260G, and 260B) are formed in the recesses 252R, 252G, and 252B, respectively. In some embodiments, the visible light filters may be used to filter through visible light. The color filters 260R, 260G, and 260B may be used to filter through a red wavelength band, a green wavelength band, and a blue wavelength band, respectively.

Afterwards, lenses 270 are respectively formed over the color filters 260R, 260G, and 260B, in accordance with some embodiments. The lenses 270 are used to direct or focus the incident light. The lenses 270 may include a microlens array. The lenses 270 may be made of a high transmittance material.

For example, the high transmittance material includes transparent polymer material (such as polymethylmethacrylate, PMMA), transparent ceramic material (such as glass), other applicable materials, or a combination thereof. As shown in FIG. 1J, the carrier substrate 210 is removed, in accordance with some embodiments. In this step, an image sensor device 100 is substantially formed, in accordance with some embodiments.

As shown in FIG. 1J, incident light L passing through the light-sensing region 116 under the color filter 260R and arriving at the passivation layer 160 (or the isolation structure 170) may be reflected by the passivation layer 160 (or the isolation structure 170) and thus travel back into the light-sensing region 116 under the color filter 260R. Therefore, the passivation layer 160 (and/or the isolation structure 170) may reduce optical crosstalk and improve quantum efficiency.

In the image sensor device 100, the isolation structures 140 and 170 and the passivation layer 160 partially protrude from the front surface 112, in accordance with some embodiments. Each of the isolation structures 140 and 170 and the passivation layer 160 surrounds each of the light-sensing regions 116, in accordance with some embodiments.

The passivation layer 160 is positioned between the isolation structure 170 and the isolation structure 140 and between the isolation structure 170 and the semiconductor substrate 110, in accordance with some embodiments. The isolation structure 170 is separated from the semiconductor substrate 110 by the passivation layer 160, in accordance with some embodiments. The isolation structure 170 is separated from the isolation structure 140 by the passivation layer 160, in accordance with some embodiments. The passivation layer 160 is in direct contact with the isolation structure 170, the isolation structure 140, and the semiconductor substrate 110, in accordance with some embodiments. The isolation structure 140 is in direct contact with the semiconductor substrate 110 and the interconnection structure 190, in accordance with some embodiments.

In accordance with some embodiments, image sensor devices and methods for forming the same are provided. The methods (for forming the image sensor device) form a shallow trench isolation structure and a deep trench isolation structure from the same surface of a substrate, and therefore the alignment accuracy of the deep trench isolation structure with respect to the shallow trench isolation structure is greater than the alignment accuracy of two isolation structures, which are respectively formed from a front surface and a back surface of a substrate. As a result, the process yield of the deep trench isolation structure is improved.

In accordance with some embodiments, a method for forming an image sensor device is provided. The method includes providing a substrate having a front surface and a back surface. The method includes removing a first portion of the substrate from the front surface to form a first trench in the substrate. The method includes forming a first isolation structure in the first trench. The first isolation structure has a top surface facing away from the back surface. The method includes removing a second portion of the first isolation structure from the top surface and a third portion of the substrate to form a second trench passing through the first isolation structure and extending into the substrate. The method includes forming a second isolation structure in the second trench. The method includes forming a light-sensing region in the substrate and adjacent to the front surface. The second isolation structure surrounds the light-sensing region. The method includes removing a fourth portion of the substrate from the back surface to expose a first bottom portion of the second isolation structure and a backside of the light-sensing region.

In accordance with some embodiments, a method for forming an image sensor device is provided. The method includes providing a substrate having a front surface and a back surface. The method includes forming a first isolation structure in the substrate. The first isolation structure partially protrudes from the front surface. The method includes forming a trench passing through the first isolation structure and extending into the substrate. The method includes forming a second isolation structure in the trench. The method includes forming a light-sensing region in the substrate. The second isolation structure surrounds the light-sensing region. The method includes thinning the substrate from the back surface to expose a first bottom portion of the second isolation structure and a backside of the light-sensing region.

In accordance with some embodiments, an image sensor device is provided. The image sensor device includes a substrate having a front surface, a back surface, and a light-sensing region. The image sensor device includes a first isolation structure in the substrate and adjacent to the front surface. The first isolation structure surrounds the light-sensing region. The image sensor device includes a second isolation structure passing through the first isolation structure and the substrate under the first isolation structure. The second isolation structure surrounds the light-sensing region and a portion of the first isolation structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming an image sensor device, comprising:
providing a substrate having a front surface and a back surface;
removing a first portion of the substrate from the front surface to form a first trench in the substrate;
forming a first isolation structure in the first trench, wherein the first isolation structure has a top surface facing away from the back surface;
removing a second portion of the first isolation structure from the top surface and a third portion of the substrate to form a second trench passing through the first isolation structure and extending into the substrate;
forming a second isolation structure in the second trench;
forming a light-sensing region in the substrate and adjacent to the front surface, wherein the second isolation structure surrounds the light-sensing region; and
removing a fourth portion of the substrate from the back surface to expose a first bottom portion of the second isolation structure and a backside of the light-sensing region.

2. The method for forming an image sensor device as claimed in claim 1, wherein the formation of the second isolation structure in the second trench comprises:
performing a plasma enhanced atomic layer deposition process to form an insulating layer over the front surface and in the second trench; and
removing the insulating layer outside of the second trench, wherein the insulating layer remaining in the second trench forms the second isolation structure.

3. The method for forming an image sensor device as claimed in claim 1, further comprising:
after the formation of the second trench and before the formation of the second isolation structure, forming a passivation layer in the second trench to cover an inner wall and a bottom surface of the second trench, wherein the passivation layer is doped with boron, phosphorous, nitrogen, arsenic, or fluorine, the second isolation structure is formed over the passivation layer, and the removal of the fourth portion of the substrate further comprises removing a second bottom portion of the passivation layer.

4. The method for forming an image sensor device as claimed in claim 3, wherein the formation of the passivation layer and the second isolation structure comprises:
performing a first plasma enhanced atomic layer deposition process to form a first insulating layer doped with boron, phosphorous, nitrogen, arsenic, or fluorine over the front surface and in the second trench;
performing a second plasma enhanced atomic layer deposition process to form a second insulating layer over the first insulating layer; and
removing the first insulating layer and the second insulating layer outside of the second trench, wherein the first insulating layer remaining in the second trench forms the passivation layer, and the second insulating layer remaining in the second trench forms the second isolation structure.

5. The method for forming an image sensor device as claimed in claim 4, further comprising:
after the formation of the first isolation structure and before the formation of the second trench, forming a protection layer over the front surface and the first isolation structure, wherein the second trench further passes through the protection layer, and the removal of the first insulating layer and the second insulating layer outside of the second trench further comprises removing the protection layer.

6. The method for forming an image sensor device as claimed in claim 5, further comprising:

before the formation of the first trench, forming a stop layer over the front surface, wherein the first trench passes through the stop layer, the protection layer is formed over the stop layer, and the stop layer is removed after the removal of the protection layer.

7. The method for forming an image sensor device as claimed in claim 5, wherein the removal of the first insulating layer and the second insulating layer outside of the second trench and the protection layer comprises:
performing a chemical mechanical polishing process to remove the first insulating layer and the second insulating layer outside of the second trench and the protection layer.

8. The method for forming an image sensor device as claimed in claim 1, wherein the removal of the fourth portion of the substrate comprises:
thinning the substrate from the back surface to expose the first bottom portion of the second isolation structure and the backside of the light-sensing region.

9. The method for forming an image sensor device as claimed in claim 1, further comprising:
after the formation of the light-sensing region and before the removal of the fourth portion of the substrate, forming an active device or a passive device on the front surface.

10. The method for forming an image sensor device as claimed in claim 1, further comprising:
after the removal of the fourth portion of the substrate, forming a color filter over the back surface.

11. A method for forming an image sensor device, comprising:
providing a substrate having a front surface and a back surface;
forming a first isolation structure in the substrate, wherein the first isolation structure partially protrudes from the front surface;
forming a trench passing through the first isolation structure and extending into the substrate;
forming a second isolation structure in the trench;
forming a light-sensing region in the substrate, wherein the second isolation structure surrounds the light-sensing region; and
thinning the substrate from the back surface to expose a first bottom portion of the second isolation structure and a backside of the light-sensing region.

12. The method for forming an image sensor device as claimed in claim 11, wherein the formation of the second isolation structure in the trench comprises:
performing a plasma enhanced atomic layer deposition process to form an insulating layer over the front surface and in the trench; and
removing the insulating layer outside of the trench, wherein the insulating layer remaining in the trench forms the second isolation structure.

13. The method for forming an image sensor device as claimed in claim 11, further comprising:
after the formation of the trench and before the formation of the second isolation structure, forming a passivation layer in the trench to cover an inner wall and a bottom surface of the trench, wherein the passivation layer is doped with boron, phosphorous, nitrogen, arsenic, or fluorine, the second isolation structure is formed over the passivation layer, and the thinning of the substrate from the back surface further comprises removing a second bottom portion of the passivation layer.

14. The method for forming an image sensor device as claimed in claim 13, wherein the formation of the passivation layer and the second isolation structure comprises:
performing a first plasma enhanced atomic layer deposition process to form a first insulating layer doped with boron, phosphorous, nitrogen, arsenic, or fluorine over the front surface and in the trench;
performing a second plasma enhanced atomic layer deposition process to form a second insulating layer over the first insulating layer; and
removing the first insulating layer and the second insulating layer outside of the trench, wherein the first insulating layer remaining in the trench forms the passivation layer, and the second insulating layer remaining in the trench forms the second isolation structure.

15. The method for forming an image sensor device as claimed in claim 13, wherein a first top surface of the first isolation structure, a second top surface of the second isolation structure, and a third top surface of the passivation layer are substantially coplanar.

16. A method for forming an image sensor device, comprising:
providing a substrate having a front surface and a back surface;
removing a first portion of the substrate from the front surface to form a first trench in the substrate;
forming a first isolation structure in the first trench, wherein the first isolation structure has a top surface facing away from the back surface;
removing a second portion of the first isolation structure from the top surface and a third portion of the substrate to form a second trench passing through the first isolation structure and extending into the substrate, wherein the first isolation structure is divided into a first portion and a second portion by the second trench;
forming a second isolation structure in the second trench;
forming a light-sensing region in the substrate and adjacent to the front surface, wherein the first isolation structure and the second isolation structure together surround the light-sensing region, and the second isolation structure is between the first portion and the second portion; and
removing a fourth portion of the substrate from the back surface to expose a first bottom portion of the second isolation structure and a backside of the light-sensing region.

17. The method for forming an image sensor device as claimed in claim 16, wherein the second isolation structure separates the first portion from the second portion.

18. The method for forming an image sensor device as claimed in claim 16, wherein the second isolation structure is thicker than the first isolation structure.

19. The method for forming an image sensor device as claimed in claim 16, further comprising:
after the formation of the second trench and before the formation of the second isolation structure, forming a passivation layer in the second trench to cover an inner wall and a bottom surface of the second trench, wherein the passivation layer is doped with boron, phosphorous, nitrogen, arsenic, or fluorine, the second isolation structure is formed over the passivation layer, and the removal of the fourth portion of the substrate further comprises removing a second bottom portion of the passivation layer.

20. The method for forming an image sensor device as claimed in claim 19, wherein the second isolation structure is separated from the substrate and the first isolation structure by the passivation layer.

* * * * *